US007587652B2

(12) United States Patent
Nishizawa et al.

(10) Patent No.: US 7,587,652 B2
(45) Date of Patent: Sep. 8, 2009

(54) VARIABLE POWER DISTRIBUTOR, ERROR DETECTION METHOD THEREOF, AND SET VALUE CORRECTION METHOD

(75) Inventors: Kazushi Nishizawa, Tokyo (JP); Nobuyasu Takemura, Tokyo (JP); Hiroaki Miyashita, Tokyo (JP); Yoshihiko Konishi, Tokyo (JP); Izuru Naitou, Tokyo (JP); Yoshihiko Imai, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 542 days.

(21) Appl. No.: 10/567,925

(22) PCT Filed: Mar. 26, 2004

(86) PCT No.: PCT/JP2004/004270

§ 371 (c)(1),
(2), (4) Date: Feb. 10, 2006

(87) PCT Pub. No.: WO2005/034281

PCT Pub. Date: Apr. 14, 2005

(65) Prior Publication Data

US 2006/0234869 A1 Oct. 19, 2006

(30) Foreign Application Priority Data

Sep. 30, 2000 (WO) ...................... PCT/JP03/12543

(51) Int. Cl.
*G06F 11/30* (2006.01)
*H03M 13/00* (2006.01)
*G08C 25/00* (2006.01)

(52) U.S. Cl. ...................................... 714/746; 375/316

(58) Field of Classification Search ................. 714/746; 375/316
See application file for complete search history.

(56) References Cited

U.S. PATENT DOCUMENTS 5,940,448 A * 8/1999 Kuo .......................... 375/316

(Continued)

FOREIGN PATENT DOCUMENTS

EP 0 823 747-A 2 2/1998

(Continued)

OTHER PUBLICATIONS

Isao Chiba, Shingaku Giho AP85-81, Nov. 22, 1985.

(Continued)

*Primary Examiner*—Guy J Lamarre
(74) *Attorney, Agent, or Firm*—Birch, Stewart, Kolasch & Birch, LLP.

(57) ABSTRACT

A variable power distributor capable of calculating an error between transmission lines of two systems after building a variable power distributor and correcting the set value of the amplitude and the phase according to the error, an error detection method for the variable power distributor, and a set value correction method is provided. The variable power distributor includes: a two-way distributor provided on an input side of a set of transmission lines consisting of a first and a second transmission line; a 90-degree hybrid circuit provided on an output side of the set of transmission lines; and a variable phase shifter, variable resistance attenuator, and a power amplifier provided on each line of the set of transmission lines between the two-way distributor and the 90-degree hybrid circuit. The variable power distributor further includes an error detection unit that monitors an output signal from the 90-degree hybrid circuit and detects an error existing in each component between the first and the second transmission lines based on the monitor output.

17 Claims, 13 Drawing Sheets

U.S. PATENT DOCUMENTS

| | | | |
|---|---|---|---|
| 6,006,111 A | 12/1999 | Rowland et al. | |
| 2001/0006359 A1* | 7/2001 | Suzuki et al. | 333/14 |
| 2004/0053644 A1* | 3/2004 | Matsuyoshi et al. | 455/561 |

FOREIGN PATENT DOCUMENTS

| | | |
|---|---|---|
| JP | 59-153333 | 9/1984 |
| JP | 11-17464 | 5/1989 |
| JP | 3-165603 | 7/1991 |
| JP | 8-008660 | 1/1996 |
| JP | 2522201 B2 | 5/1996 |
| JP | 11-68443 A | 3/1999 |
| JP | 3096734 B2 | 8/2000 |
| JP | 2001-7656 A | 1/2001 |
| JP | 3367735 B2 | 11/2002 |

OTHER PUBLICATIONS

Nobuyasu Takemura et al., The Transactions of the Institute of Electronics, Information and Communication Engineers B, vol. J85-B, No. 9, pp. 1558-1565, Sep. 2002.

Seiji Mano et al., IECE '85/5, vol. J65-B, No. 5, pp. 555-560.

* cited by examiner

VARIABLE POWER DISTRIBUTOR, ERROR DETECTION METHOD THEREOF, AND SET VALUE CORRECTION METHOD

TECHNICAL FIELD

The present invention relates to a variable power distributor, an error detection method thereof, and a set value correction method, and is particularly suitable for an application to a variable power distributor used for a polarization control antenna for microwave transmission and reception.

BACKGROUND ART

There are conventional variable power distributors described in, for example, JP 2522201 B and JP 3367735 B. FIG. 13 is a diagram created with reference to those documents and shows a structure of a variable power distributor used for a transmission system. The variable power distributor shown in FIG. 13 includes a first transmission line 1 and a second transmission line 2 as a set of transmission lines. A 90-degree hybrid circuit 3 is provided on an output side of the set of the transmission lines and a 90-degree hybrid circuit 4 is provided on an input side thereof. The 90-degree hybrid circuit 4 in which one of input ends thereof is terminated is a two-way distributor (phases at two output ends are shifted to each other by 90 degrees). A normal two-way distributor may be provided instead of the 90-degree hybrid circuit 4.

A first variable phase shifter 5*a*, a first variable resistance attenuator 6*a*, and a power amplifier 7*a* are provided on the first transmission line 1 between the 90-degree hybrid circuit 4 and the 90-degree hybrid circuit 3. Similarly, a second variable phase shifter 5*b*, a second variable resistance attenuator 6*b*, and a power amplifier 7*b* are provided on the second transmission line 2 between the 90-degree hybrid circuit 4 and the 90-degree hybrid circuit 3.

Next, the operation of the variable power distributor having the above-mentioned structure will be described. An input signal is divided into two to be distributed to two systems of the first transmission line 1 and the second transmission line 2 through the 90-degree hybrid circuit 4 in which the other of the input ends thereof is terminated. An amplitude and a phase of the input signal on each of the transmission lines are subjected to variable control through the variable phase shifter 5*a* (5*b*)and the variable resistance attenuator 6*a* (6*b*). Power of the signals is amplified by the power amplifier 7*a* (7*b*). The signal is distributed through the 90-degree hybrid circuit 3. In general, ends of the 90-degree hybrid circuit 3 are connected to a polarization control antenna, so that the polarization can be arbitrarily set.

In such a variable power distributor, generally, each of components such as the 90-degree hybrid circuits 3 and 4, the variable phase shifters 5*a* and 5*b*, the variable resistance attenuators 6*a* and 6*b*, and the power amplifiers 7*a* and 7*b* normally includes an error. Therefore, in order to perform accurate control, it is considered important to detect an error in each of the components and estimate amplitude and phase correction values to be set based on the detected error.

Note that the variable phase shifters 5*a* and 5*b* and the variable resistance attenuators 6*a* and 6*b* can arbitrarily change the amplitude and the phase, so the error is not taken into account hereafter.

In the conventional variable power distributor, the components are separately checked to estimate an error in a preliminary step toward building the variable power distributor. Therefore, estimation measurement requires a time multiplied by the number of components, so that an estimation time becomes very long. After the variable power distributor is built, the error in each of the components cannot be estimated, with the result that it is impossible to estimate an error due to an interference between the components which is caused by building the variable power distributor.

As described above, in the case of the conventional variable power distributor, it is difficult to detect the error in each of the components after the variable power distributor is built. Therefore, the components are separately checked to estimate an error before building, which leads to a problem in that the estimation measurement requires the time multiplied by the number of components and thus the estimation time becomes very long. In addition, amplitude and phase set values cannot be corrected after building.

The present invention has been made to solve the above-mentioned problems. An object of the present invention is to obtain a variable power distributor capable of calculating an amplitude ratio and a phase difference as errors between transmission lines of two systems after the variable power distributor is built and correcting the amplitude and phase set values based on the errors, an error detection method thereof, and a set value correction method.

DISCLOSURE OF THE INVENTION

A variable power distributor according to the present invention includes: a set of transmission lines which are first and second transmission lines; a two-way distributor provided on an input side of the set of the transmission lines; a 90-degree hybrid circuit provided on an output side of the set of the transmission lines; and a variable phase shifter, a variable resistance attenuator, and a power amplifier which are provided on each of the set of transmission lines between the two-way distributor and the 90-degree hybrid circuit to control an amplitude and a phase of an input signal and amplify power of the input signal, and is characterized by including: a monitoring mechanism for monitoring output signals from the 90-degree hybrid circuit; and error detection means for detecting an error present in each component between the first and second transmission lines based on a monitoring output from the monitoring mechanism.

Another variable power distributor according to the present invention includes: a set of transmission lines which are first and second transmission lines; a 90-degree hybrid circuit provided on each of input and output sides of the set of the transmission lines; and a variable phase shifter and a variable resistance attenuator which are provided on each of the set of transmission lines between the 90-degree hybrid circuit provided on the input side and the 90-degree hybrid circuit provided on the output side to control an amplitude and a phase of an input signal, and is characterized by including: a monitoring mechanism for monitoring output signals from the 90-degree hybrid circuit provided on the output side; and error detection means for detecting an error present in each component between the first and second transmission lines based on a monitoring output from the monitoring mechanism.

Further, the variable power distributor according to the present invention is characterized in that the error detection means obtains, from the monitoring mechanism, output signals on the first and second transmission lines when a phase of the variable phase shifter provided on the first transmission line is rotated and output signals on the first and second transmission lines when a phase of the variable phase shifter provided on the second transmission line is rotated and detects the error present in each component between the first and second transmission lines using a rotating element electric field vector method.

Further, the variable power distributor according to the present invention is characterized in that the error detection means obtains, from the monitoring mechanism, output signals on the first and second transmission lines when a phase of the variable phase shifter provided on the first transmission line is rotated and output signals on the first and second transmission lines when a phase of the variable phase shifter provided on the second transmission line is rotated, and detects the error present in each component between the first and second transmission lines using an improved rotating element electric field vector method.

Further, the variable power distributor according to the present invention is characterized by further including control means for controlling the amplitude and the phase by correcting set values for the variable phase shifters and the variable resistance attenuators based on a detection result obtained by the error detection means.

Further, the variable power distributor according to the present invention is characterized in that the control means calculates an amplitude ratio and a phase difference between the first and second transmission lines based on the detection result obtained by the error detection means to correct the set values for the variable phase shifters and the variable resistance attenuators.

Further, according to the present invention, an error detection method for a variable power distributor is characterized by including: detecting output signals from the first and second transmission lines when a phase of the variable phase shifter provided on the first transmission line is rotated; detecting output signals from the first and second transmission lines when a phase of the variable phase shifter provided on the second transmission line is rotated; and detecting the error present in each component based on the output signals using a rotating element electric field vector method.

Further, according to another aspect of the present invention, an error detection method for a variable power distributor includes: a set of transmission lines which are first and second transmission lines; a two-way distributing circuit provided on an input side of the set of the transmission lines; a 90-degree hybrid circuit provided on an output side of the set of the transmission lines; and a variable phase shifter, a variable resistance attenuator, and a power amplifier which are provided on each of the set of transmission lines between the two-way distributor and the 90-degree hybrid circuit to control an amplitude and a phase of an input signal and amplify power of the input signal and detects an error present in each component between the first and second transmission lines, and is characterized by including: detecting output signals from the first and second transmission lines when a phase of the variable phase shifter provided on the first transmission line is rotated; detecting output signals from the first and second transmission lines when a phase of the variable phase shifter provided on the second transmission line is rotated; and detecting the error present in each component from the output signals using a rotating element electric field vector method.

Further, according to further another aspect of the present invention, an error detection method for a variable power distributor includes: a set of transmission lines which are first and second transmission lines; a 90-degree hybrid circuit provided on each of input and output sides of the set of the transmission lines; and a variable phase shifter and a variable resistance attenuator which are provided on each of the set of transmission lines between the 90-degree hybrid circuit provided on the input side and the 90-degree hybrid circuit provided on the output side to control an amplitude and a phase of an input signal and detects an error present in each component between the first and second transmission lines, and is characterized by including: detecting output signals from the first and second transmission lines when a phase of the variable phase shifter provided on the first transmission line is rotated; detecting output signals from the first and second transmission lines when a phase of the variable phase shifter provided on the second transmission line is rotated; and detecting the error present in each component based on the output signals using an improved rotating element electric field vector method.

Further, a set value correction method for the variable power distributor according to the present invention is characterized by including: obtaining an amplitude ratio and a phase difference between the first and second transmission lines based on a detection result of the error detected by the error detection method for the variable power distributor; and correcting set values for the variable phase shifters and the variable resistance attenuators.

BEST MODES FOR CARRYING OUT THE INVENTION

Embodiment 1

Figure 1:
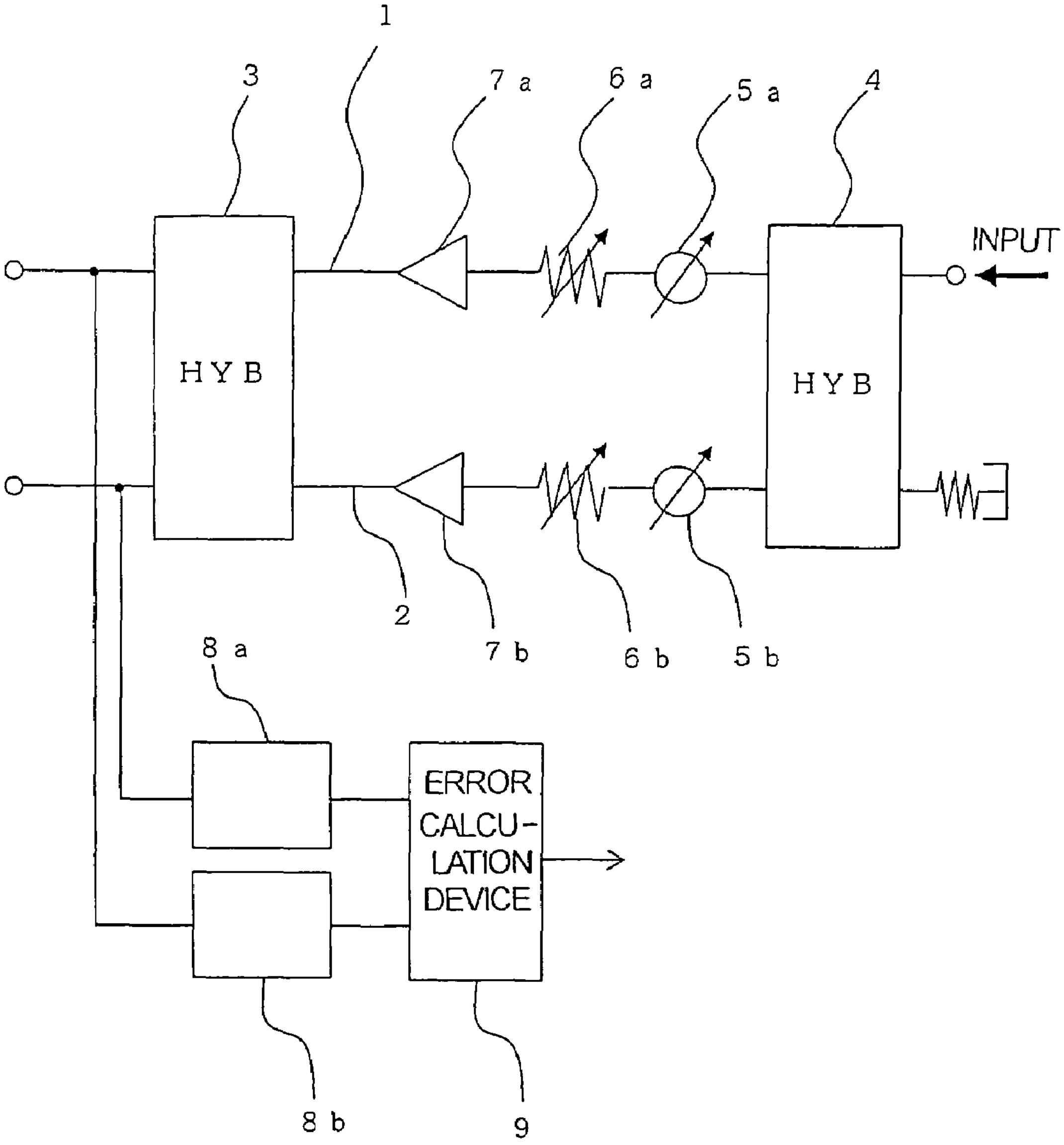
FIG. 1 is a block diagram showing a structure of a variable power distributor according to Embodiment 1 of the present invention.
Figure 13:
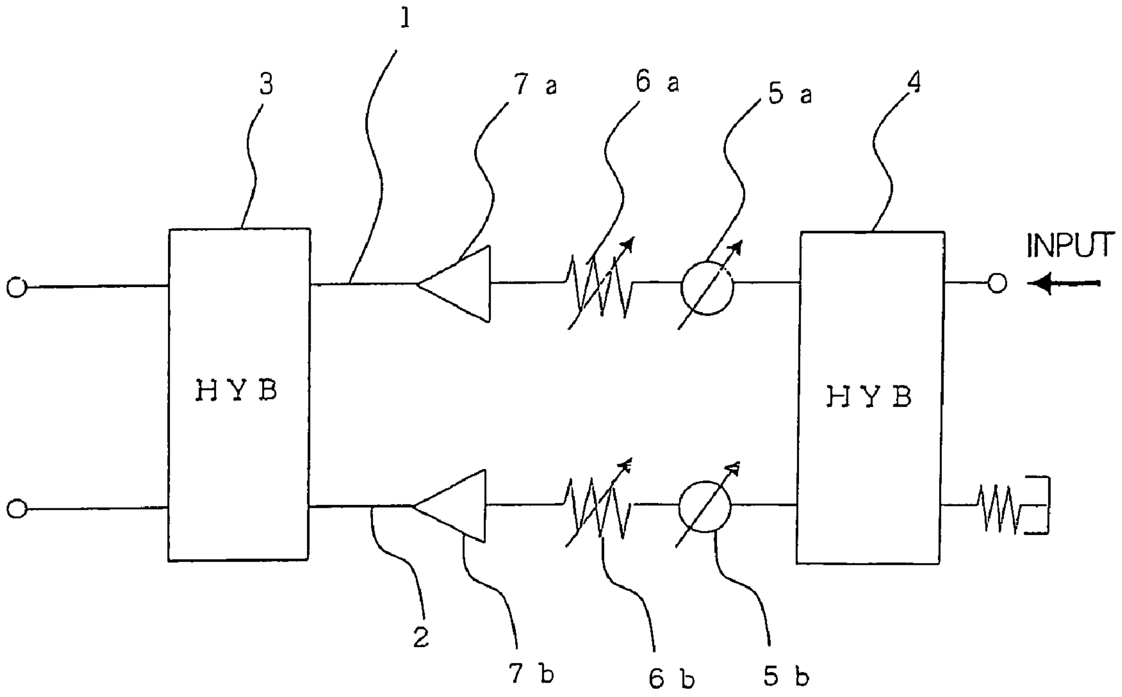
FIG. 13 is a block diagram showing a structure of a variable power distributor of a conventional example.

FIG. 1 is a block diagram showing a structure of a variable power distributor according to Embodiment 1 of the present invention. As in the conventional example shown in FIG. 13, the variable power distributor shown in FIG. 1 includes a set of transmission lines which are a first transmission line 1 and a second transmission line 2, a 90-degree hybrid circuit 3 provided on an output side of the set of the transmission lines, and a 90-degree hybrid circuit 4 provided on an input side thereof. A first variable phase shifter 5*a*, a first variable resistance attenuator 6*a*, and a power amplifier 7*a* are provided on the first transmission line 1 between the 90-degree hybrid circuit 4 and the 90-degree hybrid circuit 3. A second variable phase shifter 5*b*, a second variable resistance attenuator 6*b*, and a power amplifier 7*b* are provided on the second transmission line 2 between the 90-degree hybrid circuit 4 and the 90-degree hybrid circuit 3. Note that the 90-degree hybrid circuit 4 in which one of input ends thereof is terminated is a two-way distributor (phases at two output ends are shifted to each other by 90 degrees). A normal two-way distributor may be provided instead of the 90-degree hybrid circuit 4.

The variable power distributor according to Embodiment 1 further includes a first output signal monitoring mechanism 8*a* provided on a line branched from the first transmission line 1, a second output signal monitoring mechanism 8*b* provided on a line branched from the second transmission line 2, and an error calculation device 9 serving as an error detection means for detecting an error ratio between the first and second transmission lines 1 and 2 based on monitoring outputs from the output signal monitoring mechanisms.

Next, the operation of the variable power distributor according to Embodiment 1 will be described. An input signal is divided into two to be distributed to two systems of the first transmission line 1 and the second transmission line 2 through the 90-degree hybrid circuit 4 the other input end of which is terminated. An amplitude and a phase of the input signal on each of the transmission lines are subjected to variable control through the variable phase shifter 5*a* (5*b*)and the variable resistance attenuator 6*a* (6*b*). Power of the signals is amplified by the power amplifier 7*a* (7*b*). The signals are distributed through the 90-degree hybrid circuit 3.

Output signals from the 90-degree hybrid circuit 3 are inputted to the first output signal monitoring mechanism 8*a* and the second output signal monitoring mechanism 8*b* through the lines branched from the first transmission line 1 and the second transmission line 2. An amplitude and a phase of each of the output signals from the variable power distributor are monitored by the monitoring mechanisms.

Figure 2:
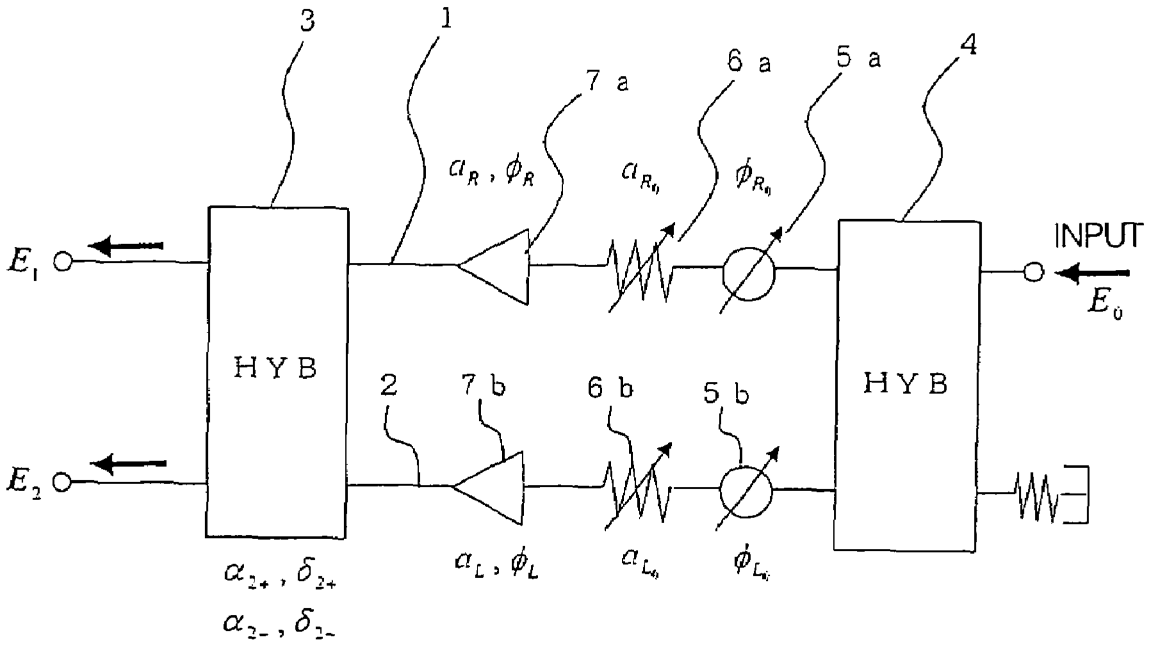
FIG. 2 is an explanatory diagram showing a model of the variable power distributor shown in FIG. 1 which is made in view of an error included in each component.

A model of the variable power distributor shown in FIG. 1 which is made in view of an error included in each component is shown in FIG. 2. In FIG. 2, assume that the input signal is $E_0$, the output signal on the first transmission line 1 is $E_1$, the output signal on the second transmission line 2 is $E_2$, error amplitude values of the 90-degree hybrid circuit 3 with respect to the first and second transmission lines 1 and 2 (including an error between the systems, of the 90-degree hybrid circuit 3) are $a_2$+and a2-, respectively, error phase values of the 90-degree hybrid circuit 3 with respect to the first and second transmission lines 1 and 2 (including an error between the systems, of the 90-degree hybrid circuit 3) are $\delta_{2+}$ and $\delta_{2-}$, respectively, error amplitude values on an input side of the 90-degree hybrid circuit 3 with respect to the first and second transmission lines 1 and 2 are $a_R$ and $a_L$, respectively, error phase values on the input side of the 90-degree hybrid circuit 3 with respect to the first and second transmission lines 1 and 2 are $\phi_R$ and $\phi_L$, respectively, amplitude set values (no error) of the variable resistance attenuators 6*a* and 6*b* are $a_{R0}$ and $a_{L0}$, respectively, and phase set values (no error) of the variable phase shifters 5*a* and 5*b* are $\phi_{R0}$ and $\phi_{L0}$, respectively. Then, the output signals $E_1$ and $E_2$ are expressed by the expression (1).

$$\begin{cases} E_1 = \alpha_{2-}a_R a_{R_0}\exp\{j(\delta_{2-} + \phi_R + \phi_{R0})\} + \alpha_{2+}a_L a_{L_0}\exp\{j(\delta_{2+} + \phi_L + \phi_{L_0})\} \\ E_2 = \alpha_{2+}a_R a_{R_0}\exp\{j(\delta_{2+} + \phi_R + \phi_{R0})\} + \alpha_{2-}a_L a_{L_0}\exp\{j(\delta_{2-} + \phi_L + \phi_{L_0})\} \end{cases} \quad (1)$$

Figure 3:
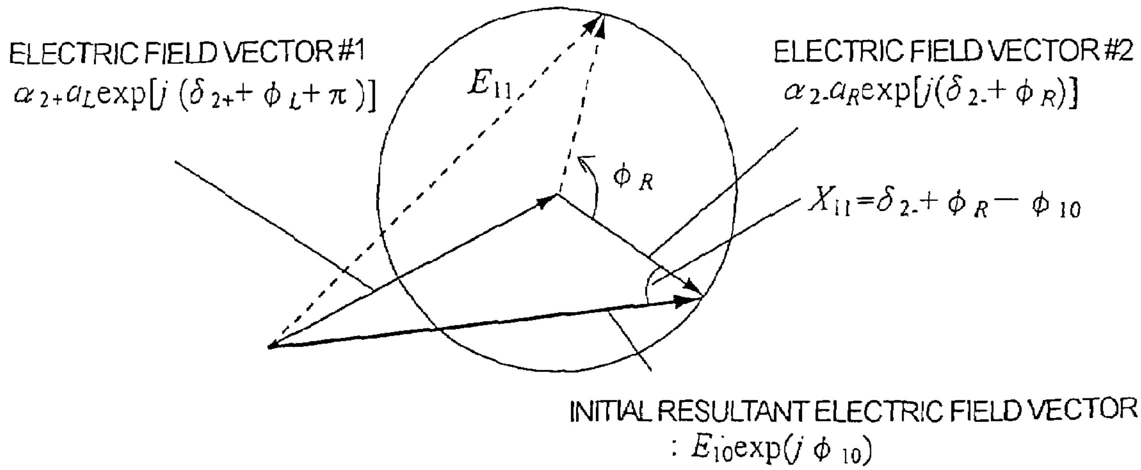
FIG. 3 is an explanatory view expressing output signals on first and second transmission lines 1 and 2 using a resultant electric field vector of two elements.

As shown in FIG. 3, the expression (1) expresses the output signals using a resultant electric field vector of two elements. Therefore, a rotating element electric field vector (REV) method described in a technical paper, "Element Amplitude and Phase Measuring Method of Phased Array Antenna-Rotating Element Electric Field Vector Method-" (Trans. IECE '82/5, Vol. J65-B, No. 5, pp. 555 to 560) can be applied to detect each component error.

A procedure for detecting each component error using the REV method will be described below with reference to FIG. 4.

(1) First, the phase of the first phase shifter 5*a* is rotated 360° and an output signal (power value $P_{11}$) from the variable power distributor at the phase set value $\phi_{R0}$ is recorded in the first output signal monitoring mechanism 8*a* (STEP 1). At this time, the second phase shifter 5*b* is not rotated. Then, the trajectory of the output signal $P_{11}$ which is close to a cosine curve as shown in FIG. 4(*a*) is obtained.

(2) Next, the phase of the first phase shifter 5*a* is rotated 360° and an output signal (power value $P_{21}$) from the variable power distributor at the phase set value $\phi_{R0}$ is recorded in the first output signal monitoring mechanism 8*b* (STEP 2). At this time, the second phase shifter 5*b* is not rotated. Then, the trajectory of the output signal $P_{21}$ which is close to a cosine curve as shown in FIG. 4(*b*) is obtained.

(3) Also, the phase of the second phase shifter 5*b* is rotated 360° and an output signal (power value $P_{12}$) from the variable power distributor at the phase set value $\phi_{L0}$ is recorded in the first output signal monitoring mechanism 8*a* (STEP 3). At this time, the first phase shifter 5*a* is not rotated. Then, the trajectory of the output signal $P_{12}$ which is close to a cosine curve as shown in FIG. 4(*c*) is obtained.

(4) Further, the phase of the second phase shifter 5*b* is rotated 360° and an output signal (power value $P_{22}$) from the variable power distributor at the phase set value $\phi_{L0}$ is recorded in the second output signal monitoring mechanism 8*b* (STEP 4). At this time, the first phase shifter 5*a* is not rotated. Then, the trajectory of the output signal $P_{22}$ which is close to a cosine curve as shown in FIG. 4(*d*) is obtained.

Note that the subscripts of the symbols used in this specification indicate the following relationships. For example, a first numeral "1" of a subscript "11" of the power value $P_{11}$ corresponds to the output of the first output signal monitoring mechanism 8*a* and a second numeral "1" thereof corresponds to the case where the phase of the first variable phase shifter 5*a* is rotated. Similarly, a subscript "21" corresponds to the output of the second output signal monitoring mechanism 8*b* in the case where the phase of the first variable phase shifter 5*a* is rotated. A subscript "12" corresponds to the output of the first output signal monitoring mechanism 8*a* in the case where the phase of the second variable phase shifter 5*b* is rotated. A subscript "22" corresponds to the output of the second output signal monitoring mechanism 8*b* in the case where the phase of the second variable phase shifter 5*b* is rotated.

Figure 4:
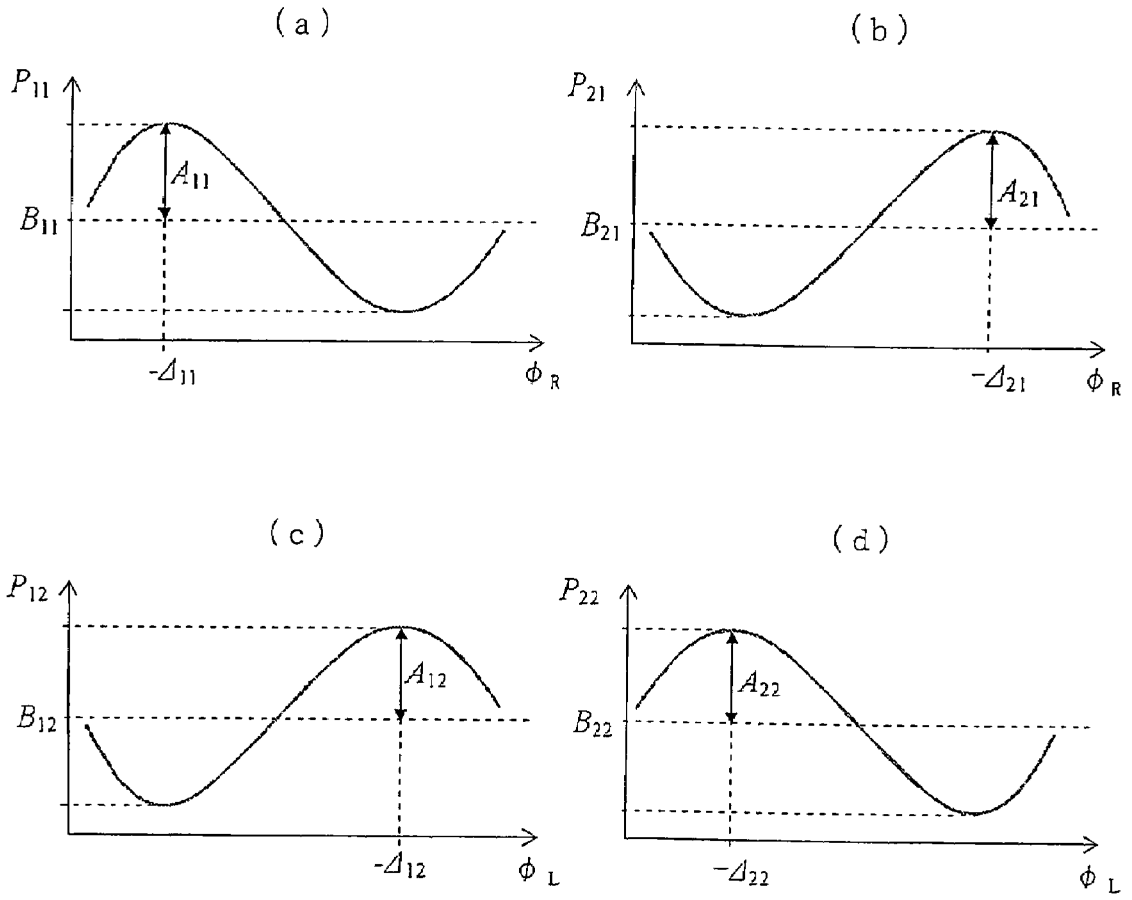
FIG. 4 is an explanatory graph showing a procedure for detecting an error of each component using a REV method.

Although the output signals obtained in the above-mentioned four STEPs are actually discrete values corresponding to the number of bits of the variable phase shifters 5*a* and 5*b*, an optimally fit cosine curve is obtained using a least squares approximation or the like (FIG. 4). The monitoring outputs are sent to the error calculation device 9.

The error calculation device 9 calculates a relative amplitude k and a relative phase X from values read from the cosine curve shown in FIG. 4 based on the following procedure. Here, an example in the case where the output signal data from the first transmission line 1 is used (FIG. 4(*a*) and FIG. 4(*c*)) will be described.

In FIG. 4(*a*), assume that a ratio between a minimal value and a maximal value of power is $r_{11}^2$, a phase set value of the first phase shifter 5*a* at the time of a maximal value $A_{11}$ is $-\Delta_{11}$, and an intermediate value between the minimal value and the maximal value of power is $B_{11}$. Then, $r_{11}$ can be expressed by the expression (2).

$$r_{11} = \pm\sqrt{\frac{B_{11} - A_{11}}{B_{11} + A_{11}}} \tag{2}$$

Here, fundamentally, $A_{11} \leqq B_{11}$. Note that $A_{11} > B_{11}$ may be held by an error caused by least squares approximation, a measurement system error, or the like. In this case, approximate calculation is performed under a condition of $A_{11} = B_{11}$. A sign of $r_{11}$ becomes positive in the case where a variation in phase of the output signal obtained by the first output signal monitoring mechanism 8*a* is equal to or smaller than 180° when the phase of the variable phase shifter 5*a* is rotated. The sign of $r_{11}$ becomes negative in the case where the variation is larger than 180°. Therefore, a solution expressed by the expression (3) is obtained from the expression (2).

$$k_{11}\left(\equiv \frac{\alpha_{2-}a_R}{E_{10}}\right) = \frac{\Gamma_{11}}{\sqrt{1 + 2\Gamma_{11}\cos\Delta_{11} + \Gamma_{11}^2}} \tag{3}$$

$$X_{11}(\equiv \delta_{2-} + \phi_R - \phi_{10}) = \tan^{-1}\left(\frac{\sin\Delta_{11}}{\cos\Delta_{11} + \Gamma_{11}}\right)$$

where $$\Gamma_{11} = \frac{1 - r_{11}}{1 + r_{11}} \tag{4}$$

Here, $E_{10}$ and $\phi_{10}$ indicate an amplitude and a phase of an initial resultant electric field vector observed in the output signal on the first transmission line 1, respectively (see FIG. 3).

Similarly, in a cosine curve of the output signal obtained when the phase of the variable phase shifter 5*b* is rotated (FIG. 4(*c*)), assume that a ratio between a minimal value and a maximal value of power is $r_{12}$ and a phase set value at the time of the maximal value is $-\Delta_{12}$. Then, when a relative amplitude $k_{12}$ and a relative phase $X_{12}$ are to be obtained using those values with reference to the above-mentioned procedure, the relative amplitude and the relative phase are expressed by the expression (5). Note that the sign of $r_{12}$ becomes reverse to that of $r_{11}$.

$$k_{12} \equiv \frac{\alpha_{2+}a_L}{E_{10}} \tag{5}$$

$$X_{12} \equiv \delta_{2+} + \phi_L - \phi_{10}$$

The output signal on the second transmission line 2 is processed in the same procedure as that described above to obtain relative amplitudes k ($k_{21}$ and $k_{22}$) and a relative phases X ($X_2$, and $X_{22}$) which are expressed by the expression (6).

$$k_{21} \equiv \frac{\alpha_{2+}a_R}{E_{20}},\ k_{22} \equiv \frac{\alpha_{2-}a_L}{E_{20}} \tag{6}$$

$$X_{21} \equiv \delta_{2+} + \phi_R - \phi_{20},\ X_{22} \equiv \delta_{2-} + \phi_L - \phi_{20}$$

Here, $E_{20}$ and $\phi_{20}$ indicate an amplitude and a phase of an initial resultant electric field vector observed in the output signal on the second transmission line 2, respectively.

As a result, the phases of the variable phase shifters 5*a* and 5*b* are rotated, the parameters related to errors (amplitudes and phases) of the variable power distributor are obtained from the expressions (3), (5), and (6) based on the principal of the REV method. An amplitude error ratio of the 90-degree hybrid circuit 3 of the variable power distributor between the first and second transmission lines 1 and 2 and a phase difference on the input side of the 90-degree hybrid circuit 3 between the first and second transmission lines 1 and 2 can be obtained from the expressions (7) and (8) based on the relational expressions (3), (5), and (6).

$$\frac{\alpha_{2-}}{\alpha_{2+}} = \sqrt{\frac{k_{11}k_{22}}{k_{12}k_{21}}},\ \frac{a_R}{a_L} = \sqrt{\frac{k_{11}k_{21}}{k_{12}k_{22}}} \tag{7}$$

$$\delta_{2-} - \delta_{2+} = \frac{1}{2}(X_{11} - X_{12} - X_{21} + X_{22}), \tag{8}$$

$$\phi_R - \phi_L = \frac{1}{2}(X_{11} - X_{12} + X_{21} - X_{22})$$

Such calculation processing is executed for error detection by the calculation processing device 9.

As is apparent from the above description, according to Embodiment 1, the output signals on the first and second transmission lines 1 and 2 of the variable power distributor are monitored by the monitoring mechanisms 8*a* and 8*b*. Monitoring data are sent to the error calculation device 9 and subjected to calculation processing using the REV method. Therefore, it is possible to detect an error (relative value between the first transmission line and the second transmission line) of each of the components of the variable power distributor. According to the error detection, the error in each of the components can be estimated after the variable power distributor is built. Therefore, it is possible to significantly shorten an estimation measurement time and reduce a cost.

Embodiment 2

Figure 5:
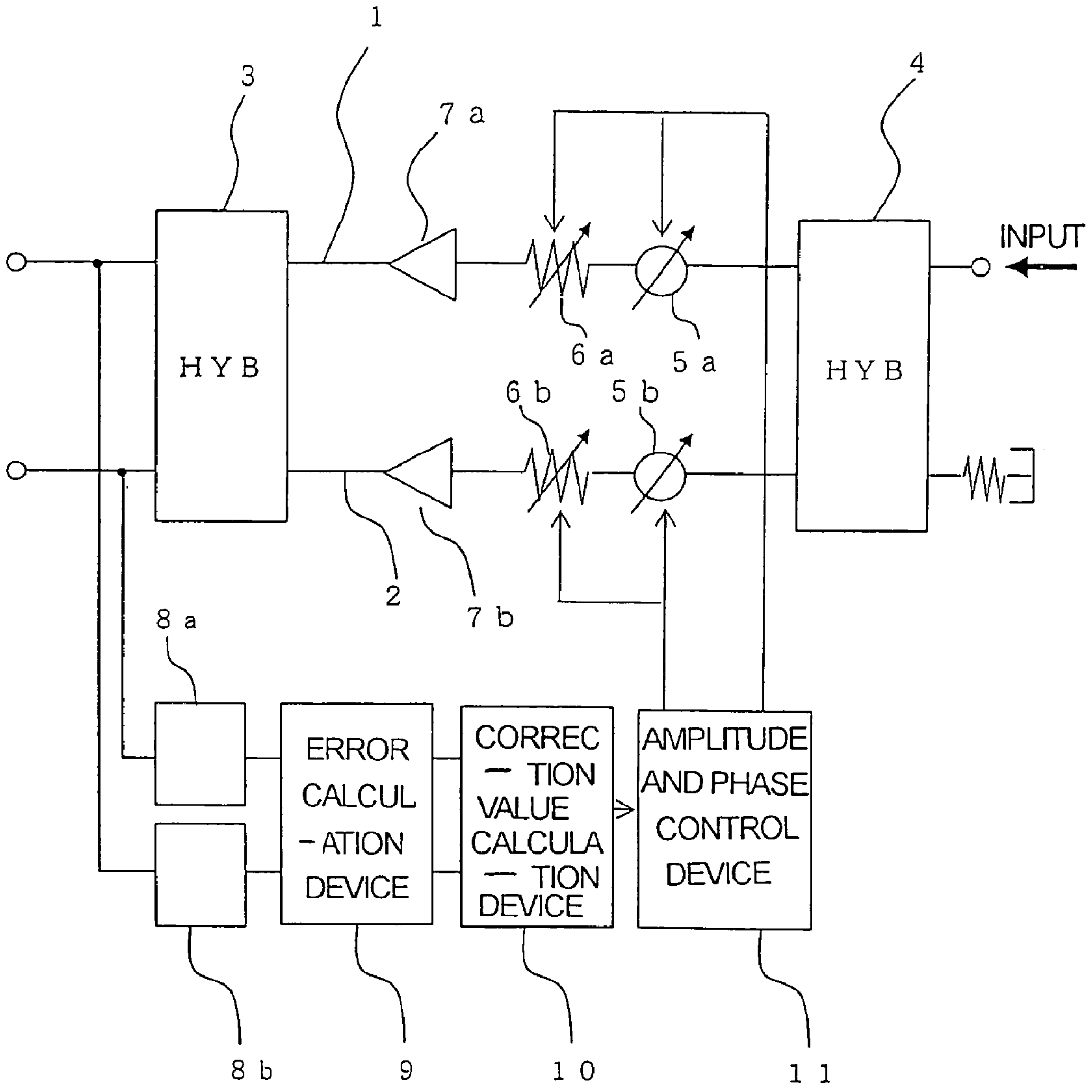
FIG. 5 is a block diagram showing a structure of a variable power distributor according to Embodiment 2 of the present invention.

FIG. 5 is a block diagram showing a structure of a variable power distributor according to Embodiment 2 of the present invention. In addition to the same structure as that in Embodiment 1 as shown in FIG. 1, the variable power distributor according to Embodiment 2 as shown in FIG. 5 further includes a correction value calculation device 10 for calculating amplitude correction values and phase correction values for the variable resistance attenuators 6*a* and 6*b* and the variable phase shifters 5*a* and 5*b* based on outputs of the error calculation device 9 and an amplitude and phase control device 11 for controlling the amplitude correction values and the phase correction values for the variable resistance attenuators 6*a* and 6*b* and the variable phase shifters 5*a* and 5*b* based on an output of the correction value calculation device 10.

Next, the operation of the variable power distributor according to Embodiment 2 will be described. According to Embodiment 1 described above, it is possible to detect the error (relative value between the first transmission line and the second transmission line) of each of the components of the variable power distributor. In Embodiment 2, amplitude set values and phase set values of the variable power distributor are corrected based on the errors to control amplitudes and phases. Error values obtained by the error calculation device 9 are sent to the correction value calculation device 10. In the correction value calculation device 10, the expressions (7) and (8) expressing the errors are substituted by the following expressions.

$$\frac{\alpha_{2-}}{\alpha_{2+}} \equiv \alpha,\ \frac{a_R}{a_L} \equiv a \tag{9}$$

$$\delta_{2-} - \delta_{2+} \equiv \delta,\ \phi_R - \phi_L \equiv \phi \tag{10}$$

When the correction values to be obtained are expressed as ratios between the first transmission line 1 and the second transmission line 2, the following expressions are obtained.

$$\frac{a_{R_0}}{a_{L_0}} \equiv A \tag{11}$$

$$\phi_{R_0} - \phi_{L_0} \equiv \psi \tag{12}$$

When the expression (1) is modified using the expressions (9) to (12), a ratio therebetween is expressed by the following expression.

$$\frac{E_1}{E_2} = \alpha \cdot \exp(\delta)\frac{1 - \exp\{-j(\delta + \phi + \psi)\}/\alpha a A}{1 + \alpha \cdot \exp\{j(\delta - \phi - \psi)\}/aA} \tag{13}$$

Here, when the left side of the above-mentioned expression is subjected to polar display and then the expression is rearranged, the following expression is obtained.

$$EaA\cdot\exp\{j(\theta-\delta)\}+E\alpha\cdot\exp\{j(\theta-\phi-\psi)\}+\exp\{-j(\delta+\phi+\psi)\}-\alpha a A=0 \tag{14}$$

Therefore, an amplitude ratio A and a phase difference ψ as the correction values of the variable power distributor between the two transmission lines are expressed by the following expressions.

$$A = \frac{-E\alpha\cdot\cos(\theta-\phi-\psi) - \cos(\delta+\phi+\psi)}{Ea\cdot\cos(\theta-\delta) - \alpha a} \tag{15}$$

$$\psi = \tan^{-1}\left(\frac{-C}{D}\right) \tag{16}$$

where $$\begin{cases} C = E^2\alpha\cdot\cos(\theta-\delta) - E\cdot\cos(\theta+\phi) + E\alpha^2\cdot\cos(\theta-\phi) + \alpha\cdot\cos(\delta+\phi) \\ D = E^2\alpha\cdot\sin(\theta-\delta) - E\cdot\sin(\theta+\phi) - E\alpha^2\cdot\sin(\theta-\phi) + \alpha\cdot\sin(\delta+\phi) \end{cases} \tag{17}$$

The amplitude ratio A is obtained by the substitution of the expression (16) into the expression (15). Similarly, the phase difference ψ is obtained by the substitution of the expression (17) into the expression (16).

As is apparent from the above description, according to Embodiment 2, the values for correcting the amplitude and phase set values in which the errors in the variable power distributor are taken into consideration can be derived based on the error (relative value between the first transmission line and the second transmission line) of each of the components of the variable power distributor.

The correction values are sent to the amplitude and phase correction value control device 11. Therefore, the control can be made so as to correct the set values for the variable resistance attenuators 6*a* and 6*b* and the variable phase shifters 5*a* and 5*b*.

As shown in FIG. 5, derivation and control systems of the amplitude and phase correction values are wired so as to give feedback to the system of the variable power distributor, thereby making it possible to make automatic feedback control to the operation of the systems.

Embodiment 3

Figure 6:
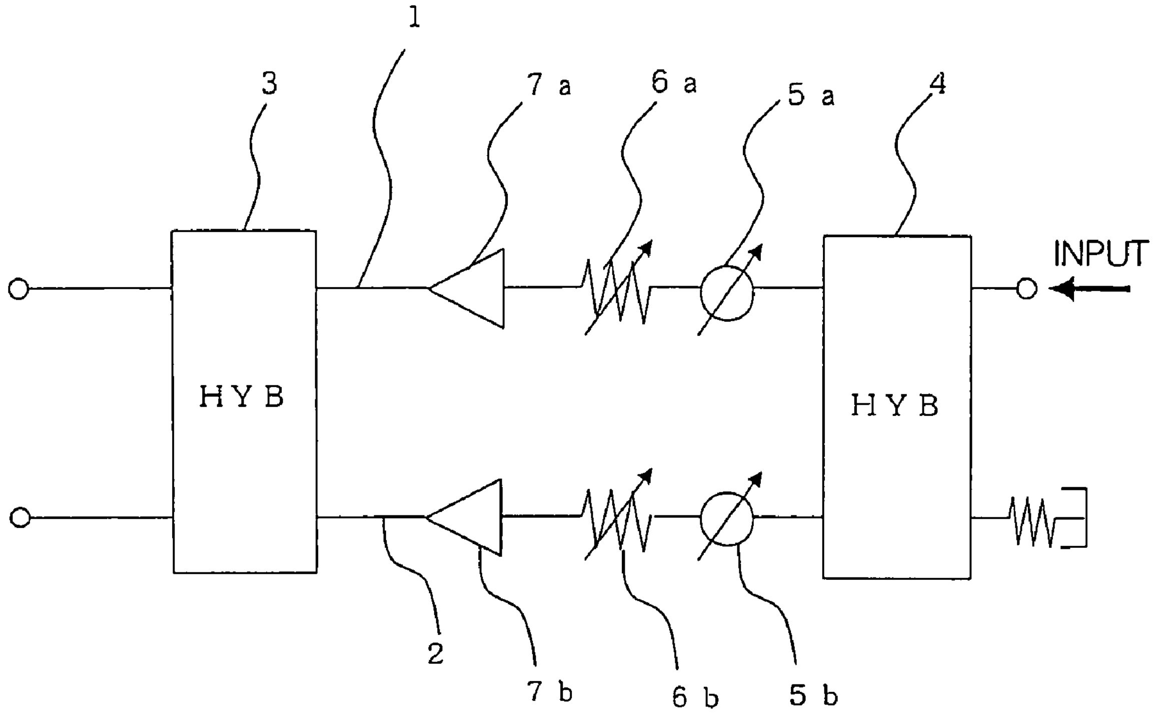
FIG. 6 is a block diagram showing a structure of a variable power distributor used for a transmission system, according to Embodiment 3 of the present invention.

FIG. 6 is a block diagram showing a structure of a variable power distributor used in a transmission system according to Embodiment 3 of the present invention. As in the conventional example shown in FIG. 13, the variable power distributor used in a transmission system shown in FIG. 6 includes a set of transmission lines which are a first transmission line 1 and a second transmission line 2, a 90-degree hybrid circuit 3 provided on an output side of the set of the transmission lines, and a two-way distributor 13 provided on an input side thereof. A first variable phase shifter 5*a*, a first variable resistance attenuator 6*a*, and a power amplifier 7*a* are provided on the first transmission line 1 between the two-way distributor 13 and the 90-degree hybrid circuit 3. A second variable phase shifter 5*b*, a second variable resistance attenuator 6*b*, and a power amplifier 7*b* are provided on the second transmission line 2 between the 90-degree hybrid circuit 4 and the 90-degree hybrid circuit 3. Note that the 90-degree hybrid circuit in which one of input ends thereof is terminated is a two-way distributing circuit (phases at two output ends are shifted to each other by 90 degrees), and may be provided instead of the two-way distributor 13.

The variable power distributor according to Embodiment 3 further includes a first output signal monitoring mechanism 8*a* provided on a line branched from the first transmission line 1, a second output signal monitoring mechanism 8*b* provided on a line branched from the second transmission line 2, and an error calculation device 9 serving as an error detection means for detecting an error ratio between the first and second transmission lines 1 and 2 based on monitoring outputs from the output signal monitoring mechanisms.

Next, the operation of the variable power distributor according to Embodiment 3 will be described. An input signal is branched to two systems of the first transmission line 1 and the second transmission line 2 through the two-way distributor 13. An amplitude and a phase of the input signal on each of the transmission lines are subjected to variable control through the variable phase shifter 5$a$ (5$b$)and the variable resistance attenuator 6$a$ (6$b$). Power of the signals is amplified by the power amplifier 7$a$ (7$b$). The signals are distributed through the 90-degree hybrid circuit 3.

Output signals from the 90-degree hybrid circuit 3 are inputted to the first output signal monitoring mechanism 8$a$ and the second output signal monitoring mechanism 8$b$ through the lines branched from the first transmission line 1 and the second transmission line 2. An amplitude and a phase of each of the output signals from the variable power distributor are monitored by the monitoring mechanisms.

Figure 7:
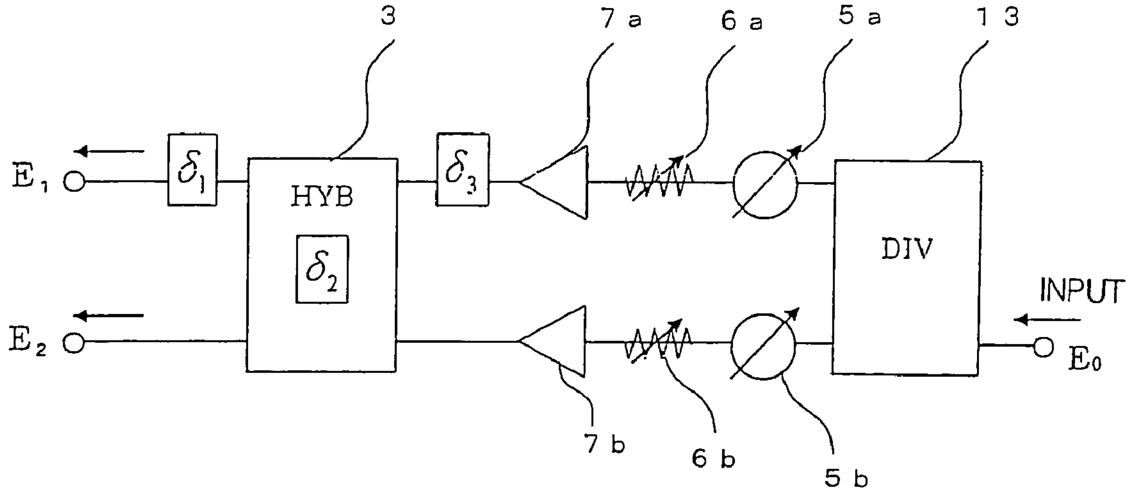
FIG. 7 is an explanatory diagram showing a model of the variable power distributor shown in FIG. 6 which is made in view of an error included in each component.

Here, a model of the variable power distributor shown in FIG. 6 which is made in view of an error included in each component is shown in FIG. 7. In FIG. 7, assume that the input signal is $E_0$, the output signal on the first transmission line 1 is $E_1$, the output signal on the second transmission line 2 is $E_2$, an error electric field value on an output side (output-terminal-$E_1$-and-$E_2$ side) relative to the 90-degree hybrid circuit 3 with respect to the first and second transmission lines 1 and 2 is $\delta_1$, an error electric field value of the 90-degree hybrid circuit 3 with respect to the first and second transmission lines 1 and 2 is $\delta_2$, and an error electric field value 12 on an input side (two-way distributor 13 side) relative to the 90-degree hybrid circuit 3 with respect to the first and second transmission lines 1 and 2 is $\delta_3$.

Next, an improved rotating element electric field vector (REV) method described in a technical paper, "Method of Measuring Array Element Electric Field and Phase Shifter Error Using Amplitude and Phase of Resultant Electric Field of Phased Array Antenna-Improved Rotating Element Electric Field Vector Method-" (Trans. IEICE '02/9, Vol. J85-B, No. 9, pp. 1558 to 1565) is applied to detect each component error.

A procedure for detecting each component error using the improved REV method will be described below.

Figure 8:
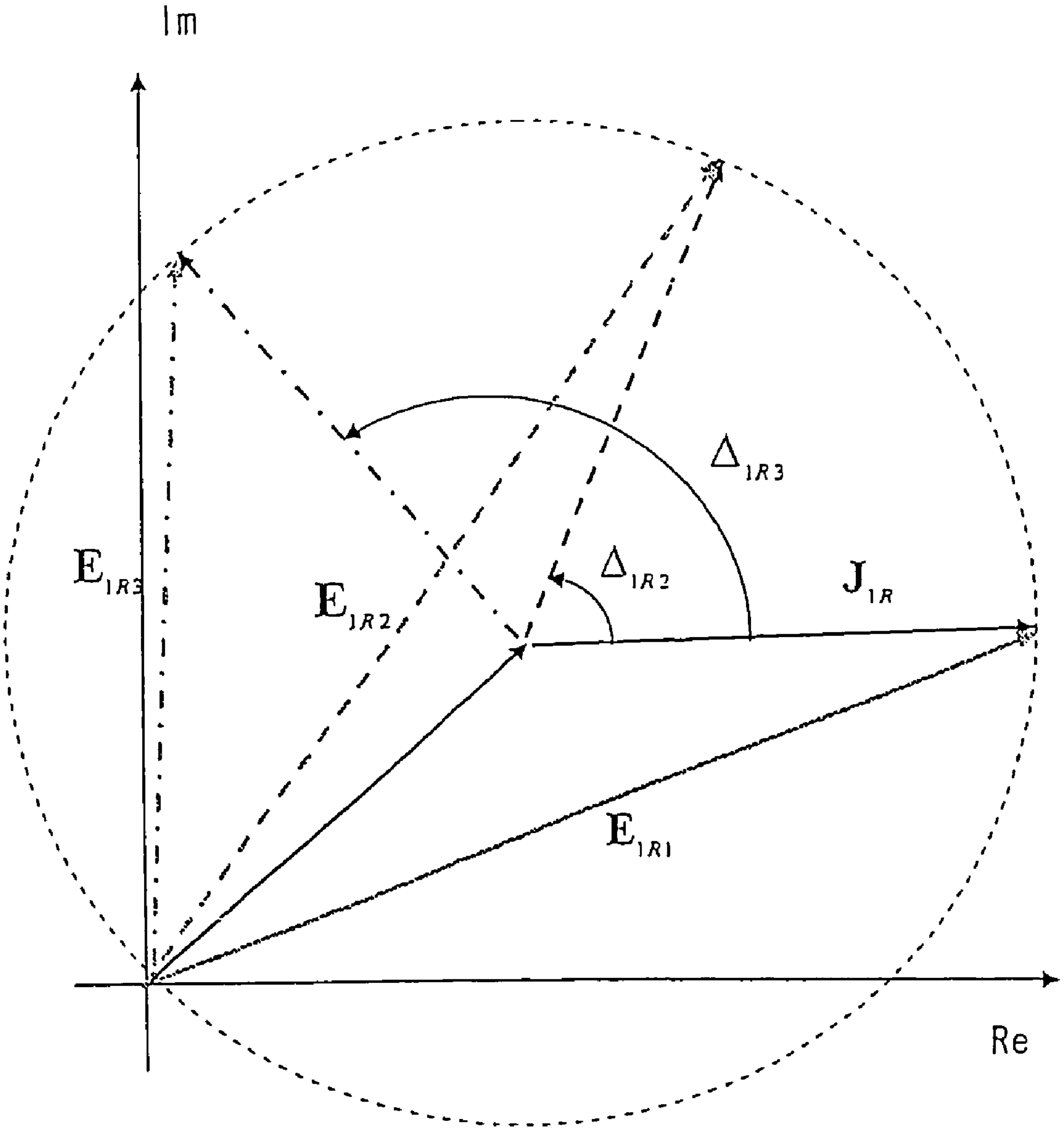
FIG. 8 is an explanatory diagram showing a procedure for detecting an error of each component using an improved REV method.

(1) First, the phase of the first phase shifter 5$a$ is rotated 360° and an output signal (power value $E_{1Rm}$) from the variable power distributor at the phase set value $\Delta_{Rm}$ is recorded in the first output signal monitoring mechanism 8$a$. At this time, the second phase shifter 5$b$ is not rotated. FIG. 8 is a vector diagram showing the transition of the power value $E_{1Rm}$ at this time.

(2) Next, the phase of the first phase shifter 5$a$ is rotated 360° and an output signal (power value $E_{2Rm}$) from the variable power distributor at the phase set value $\Delta_{Rm}$ is recorded in the second output signal monitoring mechanism 8$b$. At this time, the second phase shifter 5$b$ is not rotated.

(3) Also, the phase of the second phase shifter 5$b$ is rotated 360° and an output signal (power value $E_{1Lm}$) from the variable power distributor at the phase set value $\Delta_{Lm}$ is recorded in the first output signal monitoring mechanism 8$b$. At this time, the first phase shifter 5$a$ is not rotated.

(4) Further, the phase of the first phase shifter 5$b$ is rotated 360° and an output signal (power value $E_{2Lm}$) from the variable power distributor at the phase set value $\Delta_{Lm}$ is recorded in the second output signal monitoring mechanism 8$b$. At this time, the first phase shifter 5$a$ is not rotated.

An electric field value of each system in the case where the phase of the variable phase shifter is rotated is expressed by the expression (18) based on the output signals obtained in the above-mentioned four steps. Note that reference symbol M denotes the number of phase shifters to be set.

$$J_m = \left(E_m - \frac{1}{M}\sum_{m'=1}^{M} E_{m'}\right)e^{-j\Delta_m} \tag{18}$$

In order words, the electric field value of each system in the case where the phase of the variable phase shifter is rotated, which is expressed by the expression (18) is changed according to the phase set value. Therefore, four electric field values $J_{1Rm}$, $J_{2Rm}$, $J_{1Lm}$, and $J_{2Lm}$ are obtained by the above-mentioned steps.

Here, $J_{1Rm}$ indicates the electric field value on the first transmission line 1 in the case where the phase of the first phase shifter 5$a$ is rotated 360° and an output signal (electric field value $E_{1Rm}$) from the variable power distributor at a phase set value $\Delta_{Rm}$ is recorded in the first output signal monitoring mechanism 8$a$.

Also, $J_{2Rm}$ indicates the electric field value on the first transmission line 1 in the case where the phase of the first phase shifter 5$a$ is rotated 360° and an output signal (electric field value $E_{2Rm}$) from the variable power distributor at a phase set value $\Delta_{Rm}$ is recorded in the second output signal monitoring mechanism 8$b$.

Also, $J_{1Lm}$ indicates the electric field value on the second transmission line 2 in the case where the phase of the second phase shifter 5$b$ is rotated 360° and an output signal (electric field value $E_{1Lm}$) from the variable power distributor at a phase set value $\Delta_{Rm}$ is recorded in the first output signal monitoring mechanism 8$a$.

Further, $J_{2Lm}$ indicates the electric field value on the second transmission line 2 in the case where the phase of the second phase shifter 5$b$ is rotated 360° and an output signal (electric field value $E_{2Lm}$) from the variable power distributor at a phase set value $\Delta_{Rm}$ is recorded in the second output signal monitoring mechanism 8$b$.

When the electric field value $J_{2Lm}$ is used as a reference, the error electric field value 10 on the output side (output-terminal-$J_1$-and-$J_2$ side) relative to the 90-degree hybrid circuit 3 with respect to the first and second transmission lines 1 and 2 is $\delta_1$, the error electric field value $\delta_2$ of the 90-degree hybrid circuit 3 with respect to the first and second transmission lines 1 and 2 is $\delta_2$, and the error electric field value $\delta_3$ on the input side (two-way distributor 13 side) relative to the 90-degree hybrid circuit 3 with respect to the first and second transmission lines 1 and 2 are expressed by the expressions (19), (20), and (21), respectively.

$$\delta_1 = \frac{J_{1Lm}}{-j\delta_2 J_{2Lm}} \tag{19}$$

$$\delta_2 = \sqrt{\frac{(-1)\cdot J_{1Lm}\cdot J_{2Rm}}{J_{1Rm}\cdot J_{2Lm}}} \tag{20}$$

$$\delta_3 = \frac{J_{2Rm}}{-j\delta_2 J_{2Lm}} \tag{21}$$

Such calculation processing is executed for error detection by the error calculation device 9.

As is apparent from the above description, according to Embodiment 3, the output signals on the first and second transmission lines 1 and 2 of the variable power distributor are monitored by the monitoring mechanisms 8$a$ and 8$b$. Monitoring data are sent to the error calculation device 9 and subjected to calculation processing using the improved REV method. Therefore, it is possible to detect an error (relative value between the first transmission line and the second transmission line) of each of the components of the variable power distributor. According to the error detection, the error in each of the components can be estimated after the variable power distributor is built. Therefore, it is possible to significantly shorten an estimation measurement time and reduce a cost.

Embodiment 4

Figure 9:
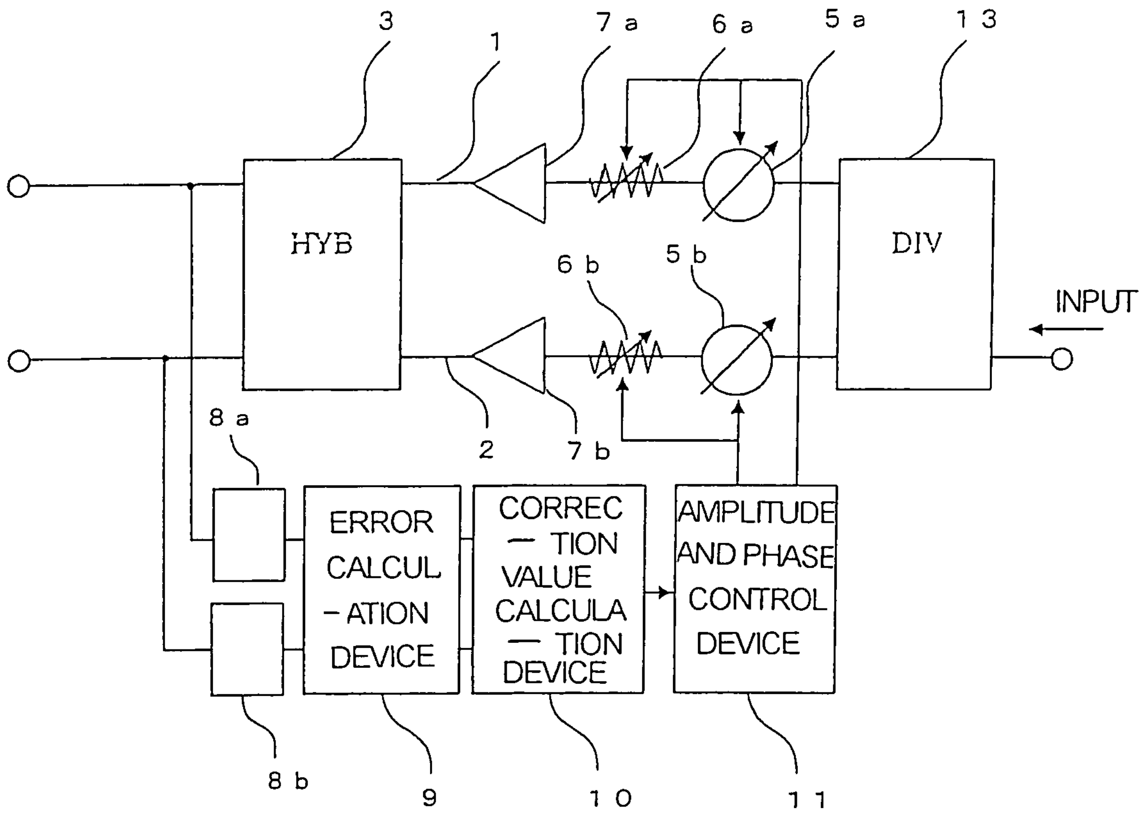
FIG. 9 is a block diagram showing a structure of a variable power distributor according to Embodiment 4 of the present invention.

FIG. 9 is a block diagram showing a structure of a variable power distributor according to Embodiment 4 of the present invention. In addition to the same structure as that in Embodiment 4 as shown in FIG. 9, the variable power distributor according to Embodiment 3 as shown in FIG. 6 further includes a correction value calculation device 10 for calculating amplitude correction values and phase correction values for the variable resistance attenuators 6*a* and 6*b* and the variable phase shifters 5*a* and 5*b* based on outputs of the error calculation device 9 and an amplitude and phase control device 11 for controlling the amplitude correction values and the phase correction values for the variable resistance attenuators 6*a* and 6*b* and the variable phase shifters 5*a* and 5*b* based on an output of the correction value calculation device 10.

Next, the operation of the variable power distributor according to Embodiment 4 will be described. According to Embodiment 3 described above, the error (relative value between the first transmission line and the second transmission line) of each of the components of the variable power distributor is detected. In Embodiment 4, amplitude set values and phase set values of the variable power distributor are corrected based on the errors to control amplitudes and phases. The values for correcting the amplitude and phase set values in which the errors in the variable power distributor are taken into calculation are calculated by the correction value calculation device 10 based on the error (relative value between the first transmission line and the second transmission line) of each of the components of the variable power distributor. The correction values are sent to the amplitude and phase correction value control device 11. Therefore, the control can be made so as to correct the set values for the variable resistance attenuators 6*a* and 6*b* and the variable phase shifters 5*a* and 5*b*. Note that the correction value calculation device 10 calculates the correction values so as to cancel the errors obtained by the error calculation device 9.

As shown in FIG. 9, derivation and control systems of the amplitude and phase correction values are wired so as to give feedback to the system of the variable power distributor, so that automatic feedback control can be made to the operation of the systems.

Embodiment 5

Figure 10:
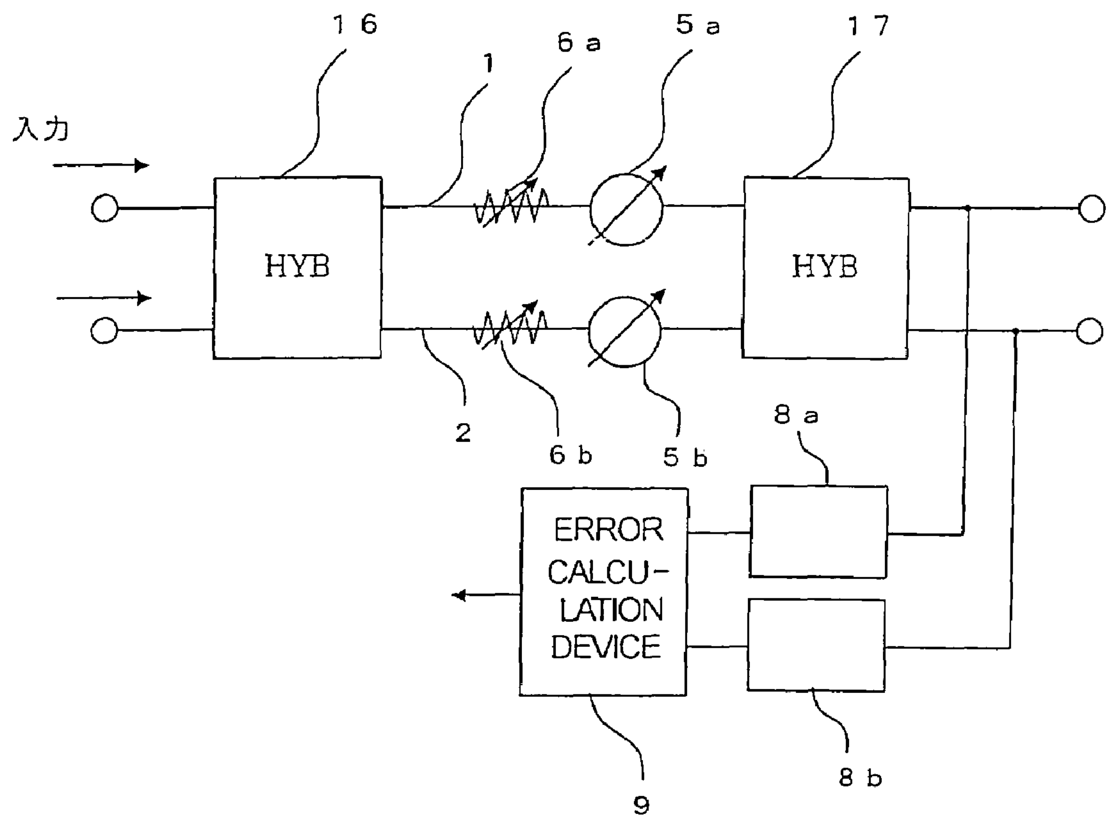
FIG. 10 is a block diagram showing a structure of a variable power distributor used for a receiving system, according to Embodiment 5 of the present invention.

FIG. 10 is a block diagram showing a structure of a variable power distributor used in a reception system according to Embodiment 5 of the present invention. As in the conventional example shown in FIG. 13, the variable power distributor shown in FIG. 10 according to Embodiment 5 includes a set of transmission lines which are a first transmission line 1 and a second transmission line 2, a 90-degree hybrid circuit 17 provided on an output side of the set of the transmission lines, and a 90-degree hybrid circuit 16 provided on an input side thereof. A first variable phase shifter 5*a* and a first variable resistance attenuator 6*a* are provided on the first transmission line 1 between the 90-degree hybrid circuit 16 and the 90-degree hybrid circuit 17. A second variable phase shifter 5*b* and a second variable resistance attenuator 6*b* are provided on the second transmission line 2 between the 90-degree hybrid circuit 16 and the 90-degree hybrid circuit 17.

The variable power distributor according to Embodiment 5 further includes a first output signal monitoring mechanism 8*a* provided on a line branched from the first transmission line 1, a second output signal monitoring mechanism 8*b* provided on a line branched from the second transmission line 2, and an error calculation device 9 serving as an error detection means for detecting an error ratio between the first and second transmission lines 1 and 2 based on monitoring outputs from the output signal monitoring mechanisms.

Next, the operation of the variable power distributor according to Embodiment 5 will be described. An input signal is branched to two systems of the first transmission line 1 and the second transmission line 2 through the 90-degree hybrid circuit 16. An amplitude and a phase of the input signal on each of the transmission lines are subjected to variable control through the variable phase shifter 5*a* (5*b*)and the variable resistance attenuator 6*a* (6*b*), and the signal is distributed through the 90-degree hybrid circuit 17.

Output signals from the 90-degree hybrid circuit 17 are inputted to the first output signal monitoring mechanism 8*a* and the second output signal monitoring mechanism 8*b* through the lines branched from the first transmission line 1 and the second transmission line 2. An amplitude and a phase of each of the output signals from the variable power distributor are monitored by the monitoring mechanisms.

Figure 11:
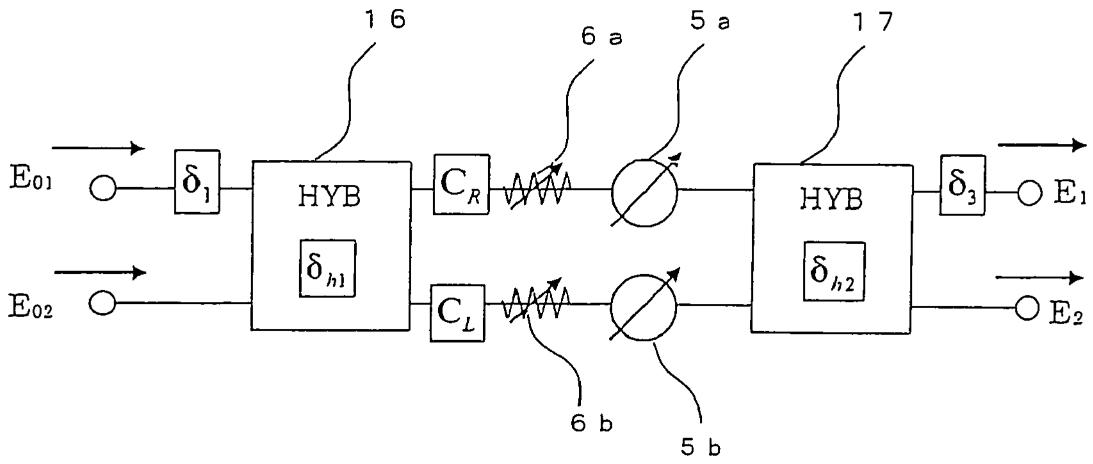
FIG. 11 is an explanatory diagram showing a model of the variable power distributor shown in FIG. 10 which is made in view of an error included in each component.

Here, a model of the variable power distributor shown in FIG. 10 which is made in view of an error included in each component is shown in FIG. 11. In FIG. 11, assume that an input signal on the first transmission line 1 is $E_{01}$, an input signal on the second transmission line 2 is $E_{02}$, the output signal on the first transmission line 1 is $E_1$, the output signal on the second transmission line 2 is $E_2$, an error electric field value on an input side (input terminal $E_{01}$ and $E_{02}$ side) relative to the 90-degree hybrid circuit 16 with respect to the first and second transmission lines 1 and 2 is $\delta_1$, an error electric field value of the 90-degree hybrid circuit 16 with respect to the first and second transmission lines 1 and 2 is $\delta_{h1}$, an error electric field value on the first transmission line 1 between the 90-degree hybrid circuit 16 and the 90-degree hybrid circuit 17 with respect to the first and second transmission lines 1 and 2 is $C_R$, and an error electric field value on the second transmission line 2 therebetween is $C_L$. In addition, assume that an error electric field value of the 90-degree hybrid circuit 16 with respect to the first and second transmission lines 1 and 2 is $\delta_{h2}$ and an error electric field value on an output side (output-terminal-$E_1$-and-$E_2$ side) relative to the 90-degree hybrid circuit 17 with respect to the first and second transmission lines 1 and 2 is $\delta_3$.

Next, a procedure for detecting each component error using the improved REV method will be described below.

(1) First, when input from the input terminal $E_{01}$, the phase of the first phase shifter 5*a* is rotated 360° and an output signal (power value $E_{1Rm\text{-}01}$) from the variable power distributor at the phase set value $\Delta_{Rm}$ is recorded in the first output signal monitoring mechanism 8*a*. At this time, the second phase shifter 5*b* is not rotated.

(2) Next, when input from the input terminal $E_{01}$, the phase of the first phase shifter 5*a* is rotated 360° and an output signal (power value $E_{2Rm\text{-}01}$) from the variable power distributor at the phase set value $\Delta_{Rm}$ is recorded in the first output signal monitoring mechanism 8*b*. At this time, the second phase shifter 5*b* is not rotated.

(3) Also, when input from the input terminal $E_{01}$, the phase of the second phase shifter 5*b* is rotated 360° and an output signal (power value $E_{1Lm\text{-}01}$) from the variable power distributor at the phase set value $\Delta_{Lm}$ is recorded in the first output signal monitoring mechanism 8*a*. At this time, the first phase shifter 5*a* is not rotated.

(4) Further, when input from the input terminal $E_{01}$, the phase of the first phase shifter 5*b* is rotated 360° and an output signal (power value $E_{2Lm\text{-}01}$) from the variable power distributor at the phase set value $\Delta_{Lm}$ is recorded in the second output signal monitoring mechanism 8*b*. At this time, the first phase shifter 5*a* is not rotated.

(5) Then, when input from the input terminal $E_{02}$, the phase of the first phase shifter 5*a* is rotated 360° and an output signal (power value $E_{1Rm\text{-}02}$) from the variable power distributor at the phase set value $\Delta_{Rm}$ is recorded in the first output signal monitoring mechanism 8*a*. At this time, the second phase shifter 5*b* is not rotated.

(6) Next, when input from the input terminal $E_{02}$, the phase of the first phase shifter 5*a* is rotated 360° and an output signal (power value $E_{2Rm\text{-}02}$) from the variable power distributor at the phase set value $\Delta_{Rm}$ is recorded in the second output signal monitoring mechanism 8*b*. At this time, the second phase shifter 5*b* is not rotated.

(7) Also, when input from the input terminal $E_{02}$, the phase of the first phase shifter 5*b* is rotated 360° and an output signal (power value $E_{1Lm\text{-}02}$) from the variable power distributor at the phase set value $\Delta_{Lm}$ is recorded in the first output signal monitoring mechanism 8*a*. At this time, the first phase shifter 5*a* is not rotated.

(8) Further, when input from the input terminal $E_{02}$, the phase of the first phase shifter 5*b* is rotated 360° and an output signal (power value $E_{2Lm\text{-}02}$) from the variable power distributor at the phase set value $\Delta_{Lm}$ is recorded in the second output signal monitoring mechanism 8*b*. At this time, the first phase shifter 5*a* is not rotated.

An electric field value of each system in the case where the phase of the variable phase shifter is rotated is expressed by the expression (18) based on the output signals obtained in the above-mentioned eight steps.

In order words, the electric field value of each system in the case where the phase of the variable phase shifter is rotated, which is expressed by the expression (18) is changed according to the phase set value. Therefore, eight electric field values $C'_{1Rm}$, $C'_{2Rm}$, $C'_{1Lm}$, $C'_{2Lm}$, $C''_{1Rm}$, $C''_{2Rm}$, $C''_{1Lm}$, and $C''_{2Lm}$ are obtained by the above-mentioned steps.

Here, $C'_{1Rm}$ indicates the electric field value on the first transmission line 1 in the case where the phase of the first phase shifter 5*a* is rotated 360° and an output signal (electric field value $E_{1Rm\text{-}01}$) from the variable power distributor at a phase set value $\Delta_{Rm}$ is recorded in the first output signal monitoring mechanism 8*a* when an input signal is inputted from the input terminal $E_{01}$.

Also, $C'_{2Rm}$ indicates the electric field value on the first transmission line 1 in the case where the phase of the first phase shifter 5*a* is rotated 360° and an output signal (electric field value $E_{2Rm\text{-}01}$) from the variable power distributor at a phase set value $\Delta_{Rm}$ is recorded in the second output signal monitoring mechanism 8*b* when an input signal is inputted from the input terminal $E_{01}$.

Also, $C'_{1Lm}$ indicates the electric field value on the second transmission line 2 in the case where the phase of the second phase shifter 5*b* is rotated 360° and an output signal (electric field value $E_{1Lm\text{-}01}$) from the variable power distributor at a phase set value $\Delta_{Lm}$ is recorded in the first output signal monitoring mechanism 8*a* when an input signal is inputted from the input terminal $E_{01}$.

Also, $C'_{2Lm}$ indicates the electric field value on the second transmission line 2 in the case where the phase of the second phase shifter 5*b* is rotated 360° and an output signal (electric field value $E_{2Lm\text{-}01}$) from the variable power distributor at a phase set value $\Delta_{Lm}$ is recorded in the second output signal monitoring mechanism 8*b* when an input signal is inputted from the input terminal $E_{01}$.

Also, $C''_{1Rm}$ indicates the electric field value on the first transmission line 1 in the case where the phase of the first phase shifter 5*a* is rotated 360° and an output signal (electric field value $E_{1Rm\text{-}02}$) from the variable power distributor at a phase set value $\Delta_{Rm}$ is recorded in the first output signal monitoring mechanism 8*a* when an input signal is inputted from the input terminal $E_{02}$.

Also, $C''_{2Rm}$ indicates the electric field value on the first transmission line 1 in the case where the phase of the first phase shifter 5*a* is rotated 360° and an output signal (electric field value $E_{2Rm\text{-}02}$) from the variable power distributor at a phase set value $\Delta_{Rm}$ is recorded in the second output signal monitoring mechanism 8*b* when an input signal is inputted from the input terminal $E_{02}$.

Also, $C''_{1Lm}$ indicates the electric field value on the second transmission line 2 in the case where the phase of the second phase shifter 5*b* is rotated 360° and an output signal (electric field value $E_{1Lm\text{-}02}$) from the variable power distributor at a phase set value $\Delta_{Lm}$ is recorded in the first output signal monitoring mechanism 8*a* when an input signal is inputted from the input terminal $E_{02}$.

Further, $C''_{2Lm}$ indicates the electric field value on the second transmission line 2 in the case where the phase of the second phase shifter 5*b* is rotated 360° and an output signal (electric field value $E_{2Lm\text{-}02}$) from the variable power distributor at a phase set value $\Delta_{Lm}$ is recorded in the second output signal monitoring mechanism 8*b* when an input signal is inputted from the input terminal $E_{02}$.

Here, the error electric field value $\delta_1$ on the input side (input terminal $E_{01}$ and $E_{02}$ side) relative to the 90-degree hybrid circuit 16 with respect to the first and second transmission lines 1 and 2, the error electric field value $\delta_{h1}$ of the 90-degree hybrid circuit 16 with respect to the first and second transmission lines 1 and 2, the error electric field value $C_R$ on the first transmission line 1 between the 90-degree hybrid circuit 16 and the 90-degree hybrid circuit 17 with respect to the first and second transmission lines 1 and 2, the error electric field value $C_L$ on the second transmission line 2 therebetween, the error electric field value $\delta_{h2}$ of the 90-degree hybrid circuit 16 with respect to the first and second transmission lines 1 and 2, and the error electric field value $\delta_3$ on the output side (output-terminal-$E_1$-and-$E_2$ side) relative to the 90-degree hybrid circuit 17 with respect to the first and second transmission lines 1 and 2 are expressed by the expressions (22), (23), (24), (25), (26) and (27), respectively.

$$\delta_1 = \sqrt{\frac{C'_{2R}C'_{2L}}{C''_{2R}C''_{2L}}} \tag{22}$$

$$\delta_{h1} = j\frac{C''_{1Rm}}{C'_{1Rm}}\sqrt{\frac{C'_{1Rm}C'_{2Lm}}{C''_{2Rm}C''_{2Lm}}} \tag{23}$$

$$C_R = 2C''_{2Lm}\sqrt{\frac{C'_{1Rm}C''_{2Rm}}{C''_{2Lm}C''_{1Lm}}} \tag{24}$$

$$C_L = 2C''_{2Lm} \tag{25}$$

-continued $$\delta_{h2} = \sqrt{-\frac{C''_{2Rm}C''_{1Lm}}{C''_{1Rm}C''_{2Lm}}} \tag{26}$$

$$\delta_3 = \sqrt{\frac{C'_{1Rm}C''_{1Lm}}{C'_{2Rm}C''_{2Lm}}} \tag{27}$$

Such calculation processing is executed for error detection by the calculation processing device 9.

As is apparent from the above description, according to Embodiment 5, the output signals on the first and second transmission lines 1 and 2 of the variable power distributor are monitored by the monitoring mechanisms 8*a* and 8*b*. Monitoring data are sent to the error calculation device 9 and subjected to calculation processing using the improved REV method. Therefore, it is possible to detect an error (relative value between the first transmission line and the second transmission line) in each of the components of the variable power distributor. According to the error detection, the error in each of the components can be estimated after the variable power distributor is built. Therefore, it is possible to significantly shorten an estimation measurement time and reduce a cost.

Embodiment 6

Figure 12:
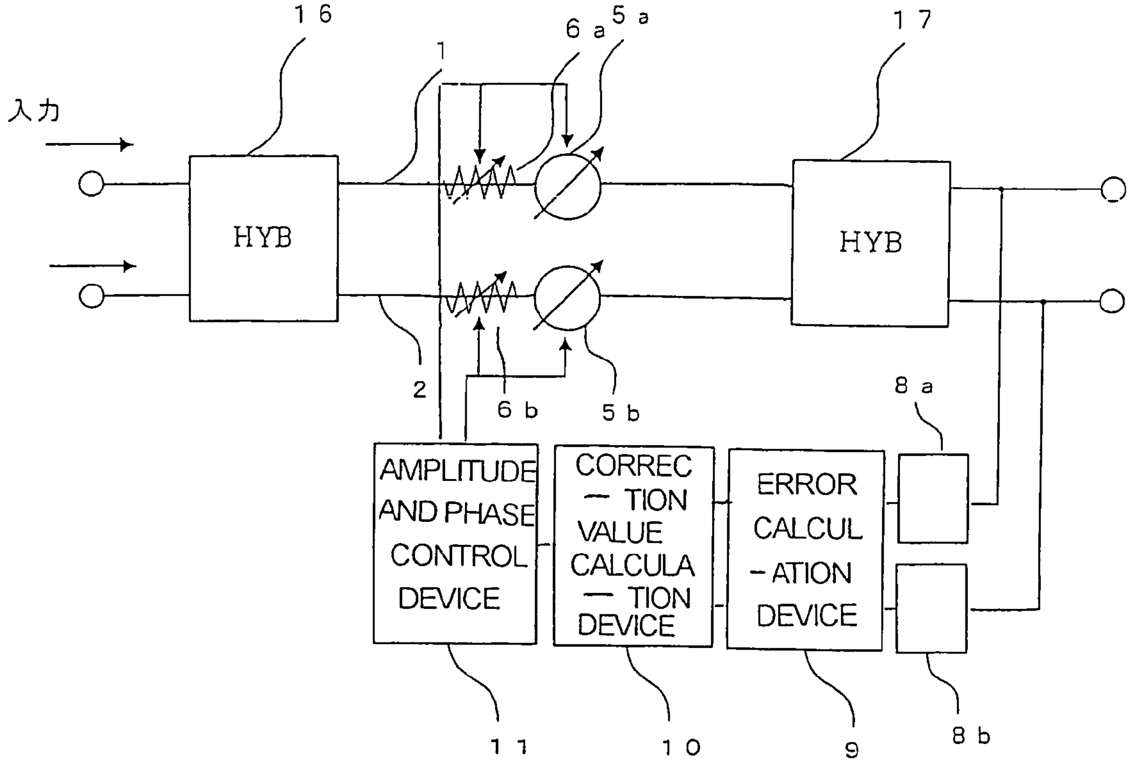
FIG. 12 is a block diagram showing a structure of a variable power distributor according to Embodiment 6 of the present invention.

FIG. 12 is a block diagram showing a structure of a variable power distributor according to Embodiment 6 of the present invention. As in Embodiment 4 shown in FIG. 9, in addition to the same structure as that in Embodiment 5 as shown in FIG. 10, the variable power distributor according to Embodiment 6 as shown in FIG. 12 further includes the correction value calculation device 10 for calculating amplitude correction values and phase correction values for the variable resistance attenuators 6*a* and 6*b* and the variable phase shifters 5*a* and 5*b* based on outputs of the error calculation device 9 and the amplitude and phase control device 11 for controlling the amplitude correction values and the phase correction values for the variable resistance attenuators 6*a* and 6*b* and the variable phase shifters 5*a* and 5*b* based on an output of the correction value calculation device 10.

That is, the values for correcting the amplitude and phase set values in which the errors in the variable power distributor are taken into calculation are calculated by the correction value calculation device 10 based on the detected error (relative value between the first transmission line and the second transmission line) in each of the components of the variable power distributor. The correction values are sent to the amplitude and phase control device 11. Therefore, the control can be made so as to correct the set values for the variable resistance attenuators 6*a* and 6*b* and the variable phase shifters 5*a* and 5*b*. Note that the correction value calculation device calculates the correction values so as to cancel the errors obtained by the error calculation device 9.

As in Embodiment 4, the derivation and control systems of the amplitude and phase correction values are wired so as to give feedback to the system of the variable power distributor, thereby making it possible to perform automatic feedback control on the operation of the systems.

INDUSTRIAL APPLICABILITY

As described above, according to the present invention, it is possible to obtain a variable power distributor in which an amplitude ratio and a phase difference as errors between transmission lines of two systems can be calculated after the variable power distributor is built and the amplitude and phase set values are corrected based on the errors, an error detection method thereof, and a set value correction method.

The invention claimed is:

1. A variable power distributor, which includes:

a set of transmission lines which are first and second transmission lines;

a two-way distributor provided on an input side of the set of transmission lines;

a 90-degree hybrid circuit provided on an output side of the set of transmission lines;

a variable phase shifter, a variable resistance attenuator, and a power amplifier provided on each line of the set of transmission lines between the two-way distributor and the 90-degree hybrid circuit to control an amplitude and a phase of an input signal and amplify power of the input signal;

a monitoring mechanism that monitors output signals from the 90-degree hybrid circuit; and an error detection unit that detects an error present in each component between the first and second transmission lines based on a monitoring output from the monitoring mechanism.

2. The variable power distributor according to claim 1, wherein the error detection unit obtains, from the monitoring mechanism, output signals from the first and second transmission lines when a phase of the variable phase shifter provided on the first transmission line is rotated, and output signals from the first and second transmission lines when a phase of the variable phase shifter provided on the second transmission line is rotated, and detects the error present in each component between the first and second transmission lines using a rotating element electric field vector method.

3. The variable power distributor according to claim 2, further comprising control unit that controls the amplitude and the phase by correcting set values for the variable phase shifters and the variable resistance attenuators based on a detection result obtained by the error detection unit.

4. The variable power distributor according to claim 3, wherein the control unit calculates an amplitude ratio and a phase difference between the first and second transmission lines based on the detection result obtained by the error detection unit to correct the set values for the variable phase shifters and the variable resistance attenuators.

5. The variable power distributor according to claim 1, wherein the error detection unit obtains, from the monitoring mechanism, output signals from the first and second transmission lines when a phase of the variable phase shifter provided on the first transmission line is rotated and output signals from the first and second transmission lines when a phase of the variable phase shifter provided on the second transmission line is rotated, and detects the error present in each component between the first and second transmission lines using an improved rotating element electric field vector method.

6. The variable power distributor according to claim 5, further comprising:

a control unit that controls the amplitude and the phase by correcting set values for the variable phase shifters and the variable resistance attenuators based on a detection result obtained by the error detection unit.

7. The variable power distributor according to claim 6, wherein the control unit calculates an amplitude ratio and a phase difference between the first and second transmission lines based on the detection result obtained by the error detection unit to correct the set values for the variable phase shifters and the variable resistance attenuators.

8. An error detection method for a variable power distributor that includes: a set of transmission lines which are first and second transmission lines; a two-way distributor provided on an input side of the set of the transmission lines; a 90-degree hybrid circuit provided on an output side of the set of the transmission lines; and a variable phase shifter, a variable resistance attenuator, and a power amplifier provided on each line of the set of transmission lines between the two-way distributor and the 90-degree hybrid circuit to control an amplitude and a phase of an input signal and amplify power of the input signal, the error detection method comprising:

detecting output signals from the first and second transmission lines when a phase of the variable phase shifter provided on the first transmission line is rotated;

detecting output signals based on the first and second transmission lines when a phase of the variable phase shifter provided on the second transmission line is rotated; and detecting the error present in each component based on the output signals using a rotating element electric field vector method.

9. A set value correction method for the variable power distributor, comprising:

obtaining an amplitude ratio and a phase difference between a first and a second transmission lines based on a detection result of an error detected by an error detection method for the variable power distributor according to claim 8; and correcting set values for a variable phase shifters and a variable resistance attenuators.

10. An error detection method for a variable power distributor that includes: a set of transmission lines which are first and second transmission lines; a two-way distributing circuit provided on an input side of the set of the transmission lines; a 90-degree hybrid circuit provided on an output side of the set of the transmission lines; and a variable phase shifter, a variable resistance attenuator, and a power amplifier provided on each line of the set of transmission lines between the two-way distributor and the 90-degree hybrid circuit to control an amplitude and a phase of an input signal and amplify power of the input signal, the error detection method comprising:

detecting output signals from the first and second transmission lines when a phase of the variable phase shifter provided on the first transmission line is rotated;

detecting output signals from the first and second transmission lines when a phase of the variable phase shifter provided on the second transmission line is rotated; and detecting the error present in each component from the output signals using a rotating element electric field vector method.

11. A set value correction method for the variable power distributor, comprising:

obtaining an amplitude ratio and a phase difference between a first and a second transmission lines based on a detection result of an error detected by an error detection method for the variable power distributor according to claim 10; and correcting set values for the variable phase shifters and the variable resistance attenuators.

12. A variable power distributor including:

a set of transmission lines which are first and second transmission lines;

a 90-degree hybrid circuit provided on each of input and output sides of the set of transmission lines;

a variable phase shifter and a variable resistance attenuator provided on each line of the set of transmission lines between the 90-degree hybrid circuit provided on the input side and the 90-degree hybrid circuit provided on the output side to control an amplitude and a phase of an input signal;

a monitoring mechanism that monitors output signals from the 90-degree hybrid circuit; and an error detection unit that detects an error present in each component between the first and second transmission lines based on a monitoring output from the monitoring mechanism.

13. The variable power distributor according to claim 12, wherein the error detection unit obtains, from the monitoring mechanism, output signals from the first and second transmission lines when a phase of the variable phase shifter provided on the first transmission line is rotated and output signals from the first and second transmission lines when a phase of the variable phase shifter provided on the second transmission line is rotated and detects the error present in each component between the first and second transmission lines using an improved rotating element electric field vector method.

14. The variable power distributor according to claim 13, further comprising control unit that controls the amplitude and the phase by correcting set values for the variable phase shifters and the variable resistance attenuators based on a detection result obtained by the error detection unit.

15. The variable power distributor according to claim 14, wherein the control unit calculates an amplitude ratio and a phase difference between the first and second transmission lines based on the detection result obtained by the error detection unit to correct the set values for the variable phase shifters and the variable resistance attenuators.

16. An error detection method for a variable power distributor that includes: a set of transmission lines which are first and second transmission lines; a 90-degree hybrid circuit provided on each of input and output sides of the set of the transmission lines; and a variable phase shifter and a variable resistance attenuator provided on each line of the set of transmission lines between the 90-degree hybrid circuit provided on the input side and the 90-degree hybrid circuit provided on the output side to control an amplitude and a phase of an input signal, the error detection method comprising:

detecting output signals from the first and second transmission lines when a phase of the variable phase shifter provided on the first transmission line is rotated;

detecting output signals from the first and second transmission lines when a phase of the variable phase shifter provided on the second transmission line is rotated; and detecting the error present in each component based on the output signals using an improved rotating element electric field vector method.

17. A set value correction method for a variable power distributor, comprising:

obtaining an amplitude ratio and a phase difference between a first and a second transmission lines based on a detection result of an error detected by an error detection method for a variable power distributor according to claim 16; and correcting set values for variable phase shifters and the variable resistance attenuators.

* * * * *

UNITED STATES PATENT AND TRADEMARK OFFICE

CERTIFICATE OF CORRECTION

PATENT NO. : 7,587,652 B2
APPLICATION NO. : 10/567925
DATED : September 8, 2009
INVENTOR(S) : Takemura et al.

It is certified that error appears in the above-identified patent and that said Letters Patent is hereby corrected as shown below:

On title page

Item (30), Foreign Application Priority Data:

“September 30, 2000 (WO)................. PCT/JP03/12543”

should read

--September 30, 2003 (WO)................. PCT/JP03/12543--.

Signed and Sealed this

Second Day of February, 2010

David J. Kappos
*Director of the United States Patent and Trademark Office*